(12) United States Patent
Al-Dweik et al.

(10) Patent No.: US 10,454,615 B2
(45) Date of Patent: Oct. 22, 2019

(54) SD DECODER FOR DIGITAL COMMUNICATIONS

(71) Applicant: Khalifa University of Science and Technology, Abu Dhabi (AE)

(72) Inventors: Arafat Jamil Al-Dweik, Abu Dhabi (AE); Husameldin Mukhtar, Abu Dhabi (AE)

(73) Assignee: KHALIFA UNIVERSITY OF SCIENCE AND TECHNOLOGY, Abu Dhabi (AE)

( * ) Notice: Subject to any disclaimer, the term of this patent is extended or adjusted under 35 U.S.C. 154(b) by 0 days.

(21) Appl. No.: 15/587,548

(22) Filed: May 5, 2017

(65) Prior Publication Data

US 2018/0323811 A1  Nov. 8, 2018

(51) Int. Cl.
| | |
|---|---|
| *H03M 13/00* | (2006.01) |
| *H04L 1/00* | (2006.01) |
| *H03M 13/29* | (2006.01) |
| *H03M 13/45* | (2006.01) |
| *H04B 1/06* | (2006.01) |
| *H04L 27/20* | (2006.01) |
| *H03M 13/11* | (2006.01) |
| *H03M 13/15* | (2006.01) |
| *H03M 13/19* | (2006.01) |

(52) U.S. Cl.
CPC ...... *H04L 1/0058* (2013.01); *H03M 13/2963* (2013.01); *H03M 13/453* (2013.01); *H04L 1/005* (2013.01); *H04L 1/0045* (2013.01); *H04L 1/0052* (2013.01); *H04L 1/0057* (2013.01); *H03M 13/1102* (2013.01); *H03M 13/152* (2013.01); *H03M 13/1515* (2013.01); *H03M 13/19* (2013.01); *H04B 1/06* (2013.01); *H04L 27/2035* (2013.01)

(58) Field of Classification Search
None
See application file for complete search history.

(56) References Cited

U.S. PATENT DOCUMENTS

| | | | | |
|---|---|---|---|---|
| 5,278,871 A | * | 1/1994 | Rasky ................... | H03M 13/00 375/285 |
| 6,147,964 A | * | 11/2000 | Black ..................... | H04B 1/707 370/209 |

(Continued)

*Primary Examiner* — Mujtaba M Chaudry
(74) *Attorney, Agent, or Firm* — Hayes Soloway PC

(57) ABSTRACT

There is provided an ultra-light decoder for high speed digital communications based on block codes such as turbo product codes (TPCs). The new decoder can perform soft decision decoding without an algebraic hard decision decoder, which is the core of conventional soft decision decoders. The elimination of algebraic decoder significantly reduces the number of computations required per codeword, consequently, it reduces the decoding delay and processing power. However, reducing the decoding delay would immediately enable increasing the transmission speed, and minimize the need for large buffers at the receiver. Moreover, reducing the complexity and delay would enable using codes with high code rates to increase the system capacity, or use powerful codes with low code rates to reduce the transmission power. Such benefits can be achieved for about 1 dB loss in coding gain. There is also provided a receiver comprising the ultra-light decoder, as well as a decoding process.

20 Claims, 6 Drawing Sheets

(56) References Cited

U.S. PATENT DOCUMENTS

| | | | | |
|---|---|---|---|---|
| 6,671,852 B1 * | 12/2003 | Ariel | ............... | H03M 13/2975 |
| | | | | 714/780 |
| 7,093,179 B2 * | 8/2006 | Shea | ............... | H03M 13/098 |
| | | | | 714/755 |
| 2001/0008022 A1 * | 7/2001 | Kokuryo | ............... | H03M 13/25 |
| | | | | 714/786 |
| 2003/0221156 A1 * | 11/2003 | Berger | ............... | H03M 13/21 |
| | | | | 714/755 |
| 2004/0019843 A1 * | 1/2004 | Kishino | ............... | H03M 13/27 |
| | | | | 714/755 |
| 2006/0264180 A1 * | 11/2006 | Qiu | ............... | H04L 1/0003 |
| | | | | 455/69 |
| 2010/0199149 A1 * | 8/2010 | Weingarten | ............... | G06F 11/1068 |
| | | | | 714/773 |
| 2011/0087951 A1 * | 4/2011 | Jeong | ............... | H04B 7/04 |
| | | | | 714/780 |
| 2011/0231738 A1 * | 9/2011 | Horisaki | ............... | G06F 11/1072 |
| | | | | 714/773 |
| 2013/0294782 A1 * | 11/2013 | Liboiron-Ladouceur | ............... | H04B 10/616 |
| | | | | 398/202 |
| 2014/0153625 A1 * | 6/2014 | Vojcic | ............... | H04L 1/005 |
| | | | | 375/224 |
| 2015/0205664 A1 * | 7/2015 | Janik | ............... | G06F 11/1012 |
| | | | | 714/764 |

* cited by examiner

US 10,454,615 B2

SD DECODER FOR DIGITAL COMMUNICATIONS

FIELD OF THE INVENTION

The present invention generally relates to block codes decoders used in communication systems and more particularly to an improved Soft Decision (SD) decoder for digital communications.

BACKGROUND OF THE INVENTION

Forward error correction (FEC), known also as channel coding, is one of the key tools that enabled the massive growth of the wireless communications industry in the last decade. The basic role of FEC is to provide the users with reliable digital transmission using minimum excess power, bandwidth and complexity. Consequently, FEC substantially contributed to the success of transformation towards the $A^5$ vision (anyone to access anything from anywhere at any time on any device). Such vision has placed stringent quality of service (QoS) requirements, which require optimal design at all layers of the wireless communications protocol stack to reduce the cost, power consumption and complexity while increasing the capacity, coverage and reliability. Watching high definition television (HDTV) on small-size mobile devices is an example for such extreme QoS requirements because such application requires up to 34 Mbps with packet error rate less than $10^{-6}$. The problem becomes even more challenging when such mobile devices are used for transmission. For example, video conferencing requires up to 192 Mbps and packet error rate of less than $10^{-4}$.

Turbo Product Codes (TPCs) are currently included in various communication standards such as the IEEE 802.16 for fixed and mobile broadband wireless access systems, which is commercially known as the Worldwide Interoperability for Microwave Access (WiMAX), IEEE 802.20 Mobile Broadband Wireless Access (MBWA) for local and metropolitan area networks, and IEEE-1901 for broadband power line networks. Moreover, TPCs have been proposed for many applications such as optical communications, satellite systems, multimedia transmission and data storage devices.

There are traditionally two types of decoders used for block codes such as TPCs, Hard Decision (HD) decoders and Soft Decision (SD) decoders. As compared to SD decoders, HD decoders have poor performance and low complexity. SD decoders have better performance however they remain highly complex because they use very large number of HD decoders as part of their overall process and system.

SUMMARY OF THE INVENTION

Therefore, there is an advantage in providing an improved SD decoder which does not use HD decoders.

As a first aspect of the present invention, there is provided an improved SD decoder for digital communications configured to decode a received signal (r) using an improved SD decoding process, the received signal (r) being encoded using block coding, modulated using a modulation technique and transmitted over a communication channel subject to channel noise, wherein the improved SD decoder comprises a binary multiplier encoder configured to encode data as part of the improved SD decoding process.

As another aspect of the invention, there is provided a receiver comprising an improved SD decoder for digital communications configured to decode a received signal (r) using an improved SD decoding process, the received signal (r) being encoded using block coding, modulated using a modulation technique and transmitted over a communication channel subject to channel noise, wherein the improved SD decoder comprises a binary multiplier encoder configured to encode data as part of the improved SD decoding process.

As a further aspect of the invention, there is provided an improved SD decoding process for decoding a received signal (r), the received signal (r) being encoded using block coding, modulated using a modulation technique and transmitted over a communication channel subject to channel noise, wherein the improved SD decoding process comprises encoding data using a binary multiplier encoder as part of the improved SD decoding process.

Preferably, the improved SD decoder does not include a Hard Decision (HD) decoder and the decoding process does not involve any Hard Decision Decoding (HDD) operations.

In an embodiment of the invention, the block coding is turbo coding, however any block coding can also work.

Preferably, the received signal (r) is an analog signal comprising a transmitted signal (u) and channel noise (z) such that $r=u+z$, where the transmitted vector (u) comprises information data and parity data expressed by $u=[m_1, m_2, \ldots, m_k, p_1, p_2, \ldots, p_{n-k}]$, where $m_i$ and $p_j$ correspond to the information data and parity data respectively.

Preferably, the improved SD decoding process comprises:
a) dropping the parity data in the received signal (r) for forming a new vector $r_{1 \to k}$, where the new vector $r_{1 \to k}$ comprises least reliable q samples having respective indices;
b) determining the least reliable q samples in the new vector $r_{1 \to k}$, and marking the indices of the least reliable q samples in $r_{1 \to k}$ (marked bits);
c) computing hard decision bits of $r_{1 \to k}$;
d) generating $2^q$ vectors (error patterns) each of which has k bits by alternating values of the marked bits between zeros and ones until all possible $2^q$ combinations are generated;
e) generating $2^q$ different test patterns by adding each error pattern to the hard decision bits computed in (c);
f) encoding $2^q$ test patterns to produce $2^q$ candidate codewords; and
g) determining a successful candidate codeword among the produced $2^q$ candidate codewords, where the successful candidate is the one that has a minimum Euclidean distance to the received signal(r).

In an embodiment of the invention, the channel noise is Additive White Gaussian Noise (AWGN).

Preferably, the modulation technique is binary phase-shift keying (BPSK), however the invention can work with any other modulation technique.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

Overview of the Improved SD Decoder

The present invention relates to an improved SD decoder which is less complex than a traditional SD decoder. The improved SD decoder of the present invention does not use an HDD decoder and therefore avoids the complexity resulted from using large numbers of such HDD decoders. The improved SD decoder of the present invention can be used with any type of block codes including but not limited to Turbo Product Codes (TPCs). Also, the improved SD decoder of the present invention can be used with any type of digital communication systems, any type of communication channels and any type of modulation techniques. Though the improved SD decoding system will be illustrated in detail hereinafter using TPCs, BPSK and AWGN for block coding, modulation and communication channel, a person skilled in the art should understand that this is done for exemplary purposes only and should not be used to narrow the scope of protection.

Turbo Product Codes Construction

Figure 1:
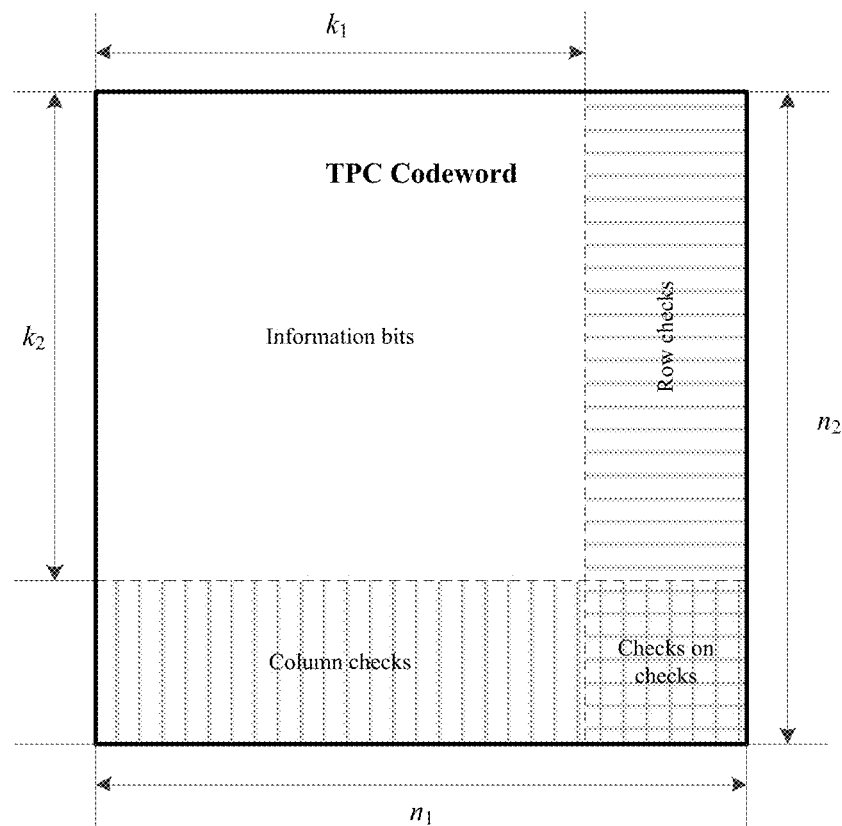
FIG. 1 illustrates a 2D TPC codeword.

Two-dimensional (2D) TPCs are constructed by serially concatenating two linear block codes $C^i$ (i=1, 2). The two component codes $C^i$, also referred to as elementary codes, have the parameters $(n_i, k_i, d_{min}^i)$ which describe the codeword length, number of information bits, and minimum Hamming distance, respectively. To build a product code, $k_1 \times k_2$ information bits are placed in a matrix of $k_1$ rows and $k_2$ columns. The $k_1$ rows are encoded by code $C^1$ and a matrix of size $k_1 \times n_1$ is generated. Then, the $n_1$ columns are encoded by the $C^2$ code and a two-dimensional codeword of size $n_2 \times n_1$ is obtained. The parameters of the product code C are $(n_1 \times n_2, k_1 \times k_2, d_{min}^{(1)} \times d_{min}^{(2)})$. The code rate which is the number of information bits divided by the codeword size is calculated as $\zeta=((k_1 \times k_2)/(n_1 \times n_2))$ for regular TPCs. FIG. 1 shows an illustration of a TPC codeword. When $n_1=n_2 \triangleq n$, $k_1=k_2 \triangleq k$ and $d_{min}^{(1)}=d_{min}^{(2)} \triangleq d_{min}$, a square product code is constructed, denoted as $(n, k, d_{min})^2$.

TPCs can be constructed using different component codes such as Hamming codes, Bose-Chaudhuri-Hocquenghem (BCH) codes, Reed-Solomon (RS) codes, and LDPC codes.

Near-Optimal Iterative Decoding of TPCs

This section surveys existing literature on TPCs iterative decoding techniques where hard and soft decision decoding methods are described. Turbo product codes are powerful FEC codes that can provide high coding gain. Nevertheless, the complexity of TPCs decoders can be very high when maximum likelihood decoding (MLD) is used. Therefore, sub-optimum iterative decoding methods are alternatively used to reduce the complexity while providing satisfactory performance. Assuming the transmission of binary phase shift keying (BPSK) symbols over an AWGN channel, a transmitted TPC codeword U is received as R=U+Z where Z is a matrix of AWGN samples with zero mean and $N_0/2$ variance. If hard decision decoding (HDD) is desired, the matrix R is converted to a binary matrix B that is fed to the TPC decoder, where B=0.5(sign[R]+1) and sign(.) is the signum function. Otherwise, R is fed directly to the decoder for soft decision decoding (SDD).

Near-optimum decoding of TPCs is achieved by performing a number of soft-input soft-output (SISO) iterative decoding processes. In the first step, the TPC matrix is partitioned into smaller row/column vectors which are individually decoded using a soft decision iterative decoding algorithm. During the first half iteration, actual soft information is available from the demodulator; however, extrinsic information is used in the succeeding iterations. The SDD is implemented using the Chase-II decoder, which performs a limited search for the maximum likelihood component code word instead of a prohibitively complex exhaustive search. The search process can be described as follows:

a) The least reliable p bits in $b=(b_1, b_2, \ldots, b_n)$, a row/column in B, are marked using $r=(r_1, r_2, \ldots, r_n)$, a row/column in R. In stationary AWGN channels, the normalized reliability is given by $|r_i|$.

b) $2^p$ different error patterns are generated using the marked p bits in b. An error pattern is a vector whose entries are all zeros except the entries marked in the previous step.

c) $2^p$ different error patterns are generated by altering the values of the marked p bits.

d) $2^p$ different test patterns are generated by adding each error pattern to b. Each of the $2^p$ test patterns is decoded using HDD to produce $2^p$ candidate codewords. The successful candidate codeword d is the one that has the minimum Euclidean distance to r. Therefore, the number of HDDs performed in each iteration is $2^p (n_1+n_2)$.

e) Once the first half iteration is completed, the Chase-II decoder output is the binary vector d; hence, we still need to generate soft information for each bit in d to enable SDD for the next iterations. Note that the elements of d are mapped from $\{0, 1\}$ to $\{-1, +1\}$. The soft information after the first iteration is calculated using $$\tilde{r}(m)=r+\alpha(m)w(m) \quad (1)$$

where $\tilde{r}(m)$ is the soft data fed to the Chase-II decoder at the mth iteration, r is the demodulator soft output, $\alpha(m)$ is a scaling factor obtained experimentally, and w(m) is the extrinsic information calculated from the previous iteration. Extrinsic information is computed as $$w(m+1)=\tilde{r}(m)-\tilde{r}(m) \quad (2)$$

where $$\tilde{r}_i(m) = \frac{1}{4}(|r-d^{(2)}|^2 - |r-d^{(1)}|^2) \times d_i^{(1)} \quad (3)$$

$|x-y|^2=\Sigma_i|x_i-y_i|^2$, $d^{(1)}$ and $d^{(2)}$ are the closest and next closest candidate codewords to r, respectively. For each bit i in $\tilde{r}(m)$, $d^{(2)}$ is chosen such that $d^2 \neq d^1$ at the ith bit, $i \in \{1, 2, \ldots, n\}$. In cases where it is not possible to find $d^{(2)}$ we use $$w_i(m)=\beta(m) \times d_i, \beta \geq 0 \quad (4)$$

where $\beta$ is also a scaling factor. The values of $\alpha$ and $\beta$ for 8 half iterations ($m \in \{1, 2, \ldots, 8\}$) are given in:

$$\alpha=[0.0,0.2,0.3,0.5,0.7,0.9,1.0,1.0] \quad (5)$$

and $$\beta=[0.2,0.4,0.6,0.8,1.0,1.0,1.0,1.0] \quad (6)$$

Figure 2:
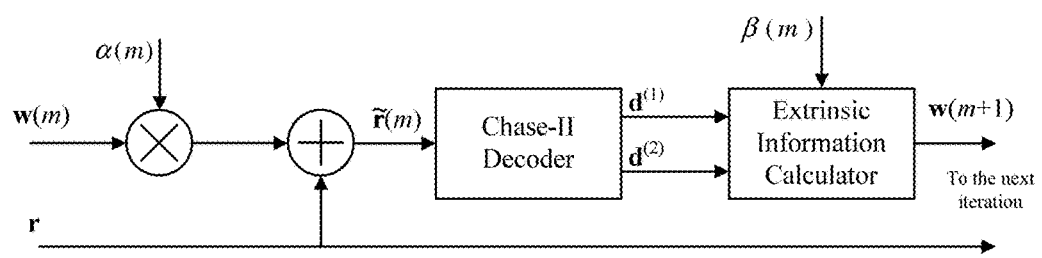
FIG. 2 illustrates a Conventional soft-input soft output (SISO) decoder based on Chase-II soft decision decoding algorithm.

Entries in the extrinsic information matrix computed using (2) are normalized to have a mean absolute value of one. FIG. 2 shows a general block diagram for Pyndiah-Chase-II decoder.

Low complexity iterative decoding can be achieved using hard-input hard-output (HIHO) decoding. HIHO is similar to SISO in terms of the iterative operations, however, each row/column in the matrix B is decoded using a single HDD operation. HIHO has very low complexity and delay, but at the expense of modest coding gain.

The New Ultra-Light Decoder (ULD)

In conventional SD decoding, the Chase-II decoder is used to perform the soft decision decoding, where each row and column in the received matrix has to go through HDD for $2^p$ times at each SDD operation. Therefore, the SISO complexity becomes much higher than HIHO, which requires only one HDD operations. Nevertheless, the SDD when combined with TPC provides spectacular coding gain as compared to the HDD. To overcome the complexity problem of TPC decoding, we propose an efficient SDD that can be used in TPC decoders.

Assume that u is codeword generated by the linear block code C with parameters (n, k, $d_{min}$). Given that the generator matrix for C is $G \in \mathbb{R}^{n \times n}$, then $$u = m \times G \qquad (7)$$

where $u=[m_1, m_2, \ldots, m_k, p_1, p_2, \ldots p_{n-k}]$, $m_i$ and $p_j$ correspond to the information and parity bits, respectively. Assuming that u is BPSK modulated, and transmitted over an AWGN channel, then the received vector r can be expressed as r=u+z, where z is the AWGN vector. Then, the new SDD process can be applied as follows:

a) Drop the last n−k samples in r, which correspond to the parity bits. The new vector becomes $r_{1 \to k}$.
b) Mark the indices (locations) of the least reliable q samples in $r_{1 \to k}$. For AWGN channels, the reliability of the ith sample is equal to $|r_i|$.
c) Compute the hard decision bits of $r_{1 \to k}$ such that $$b = \frac{1}{2}(\text{sign}(r_{1 \to k}) + 1).$$

d) Generate $2^q$ vectors (error patterns) each of which has k bits, $e_i=[e_1, e_2, \ldots, e_k]$, $i \in \{0, 1, \ldots, 2^q-1\}$. An error pattern is a vector whose entries are all zeros except the entries marked in the previous step. The values of the marked bits will be altered between zeros and ones until all possible $2^q$ combinations are generated.
e) Generate $2^q$ different test patterns by adding each error pattern to b, $t_i = e_i \oplus b$.
f) Each of the $2^q$ test patterns is then encoded by computing $\tilde{u}_i = t_i \times G$ to produce $2^q$ candidate codewords. The successful candidate codeword d is the one that has the minimum Euclidean distance to r, $$d = \arg\min_{\tilde{u}_i} |r - \tilde{u}_i|^2, i = [0, 1, \ldots, 2^q - 1] \qquad (8)$$

g) As it can be noted from the described algorithm, no HDD operations are needed to generate the candidate codewords. Once the first half iteration is completed, we generate soft information for each bit in d to enable SDD for the next iterations. Note that the elements of d are mapped from {0, 1} to {−1, +1}. The soft information after the first iteration is calculated using (1). To compute (1), the extrinsic information can be computed as $$w(m + 1) = \frac{r'(m) - \tilde{r}(m)}{\|r'(m) - \tilde{r}(m)\|_\infty} \qquad (9)$$

where the max norm $\|x\|_\infty = \max(|x_1|, |x_2|, \ldots, |k_n|)$, $$r'(m) = \frac{1}{4}(|r - d^{(2)}|^2 - |r - d^{(1)}|^2) \times d^{(1)} \qquad (10)$$

and $d^{(1)}$ and $d^{(2)}$ are the closest and next closest candidate codewords to r, respectively. Note that in (10) all bits in $\hat{r}(m)$ have the same soft value. In cases where it is not possible to find $d^{(2)}$ we use (4).

The values of α and β for 8 half iterations (m∈{1, 2, . . . , 8}) are $$\alpha = [0.0 \ 0.0 \ 0.2 \ 0.2 \ 0.3 \ 0.3 \ 0.5 \ 0.5] \qquad (11)$$

and $$\beta = [0.2 \ 0.2 \ 0.4 \ 0.4 \ 0.6 \ 0.6 \ 0.8 \ 0.8]. \qquad (12)$$

The SDD and soft output generation are applied to all rows/columns in a similar fashion to the conventional SISO decoding, till the maximum number of iterations is reached.

Numerical Examples

To evaluate the performance of the new ULD, we use bit error rate (BER) as a metric and compare the results with near optimal SISO (~Optimal) and HIHO decoding. The BER for all systems is obtained using Monte Carlo computer simulation. The channel is modeled as an AWGN channel, and the information bits are modulated using BPSK. The proposed and near-optimal decoders are using p=q=4, and the maximum number of iterations is four in all types of decoders.

Figure 3:
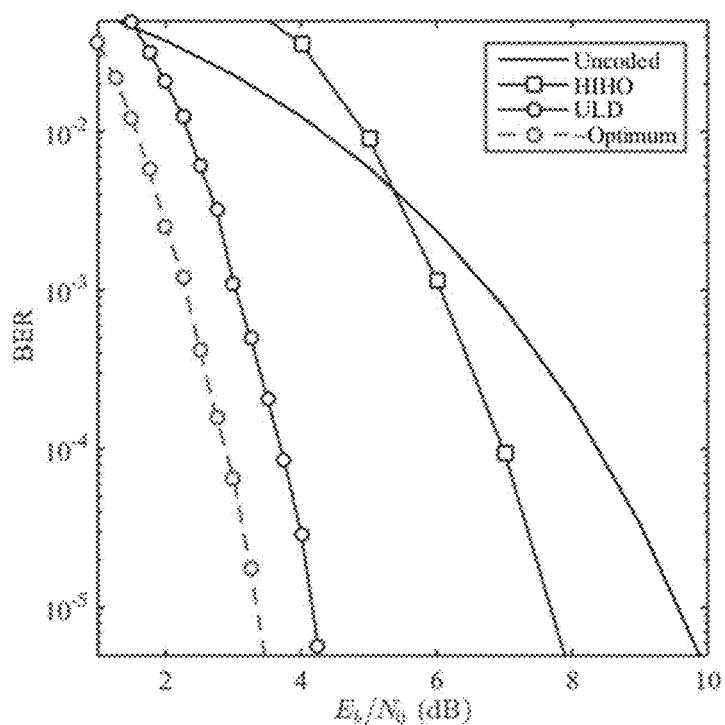
FIG. 3 illustrates BER of TPC eBCH$(16,11,4)^2$.

The BER of the eBCH$(16,11,4)^2$ is shown FIG. 3. As it can be noted from the figure, the ULD coding gain of 5.8 dB at BER=$10^{-5}$, which is only 0.8 dB less than the coding gain of the near-optimal decoder.

Figure 4:
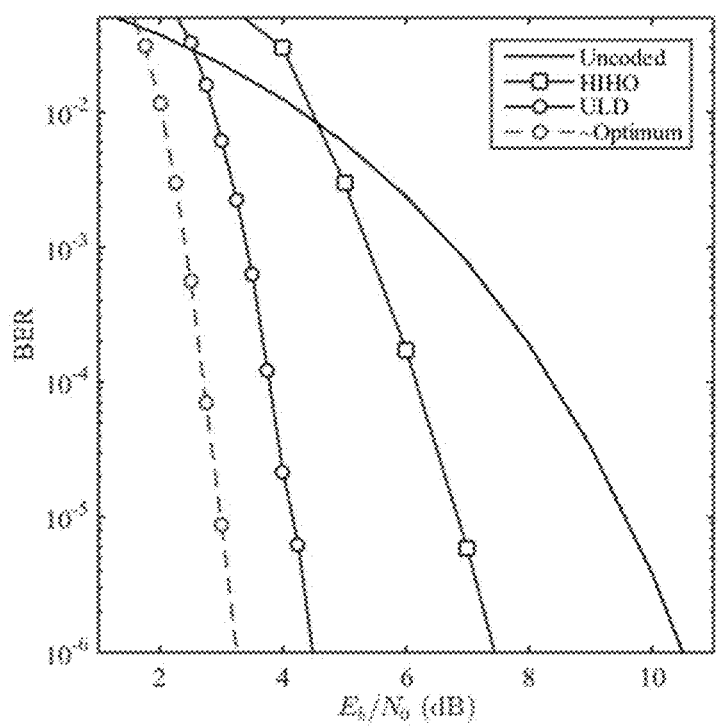
FIG. 4 illustrates BER TPC eBCH$(32,26,4)^2$.

FIG. 4 shows the BER of the eBCH$(32,26,4)^2$ TPC code. For this code, the new ULD has a gain of 5.4 dB at BER=$10^{-5}$, which is about 1.1 dB less than the coding gain of the near-optimal decoder. Moreover, the ULD coding gain advantage over the HIHO decoder is about 2.7 dB.

Figure 5:
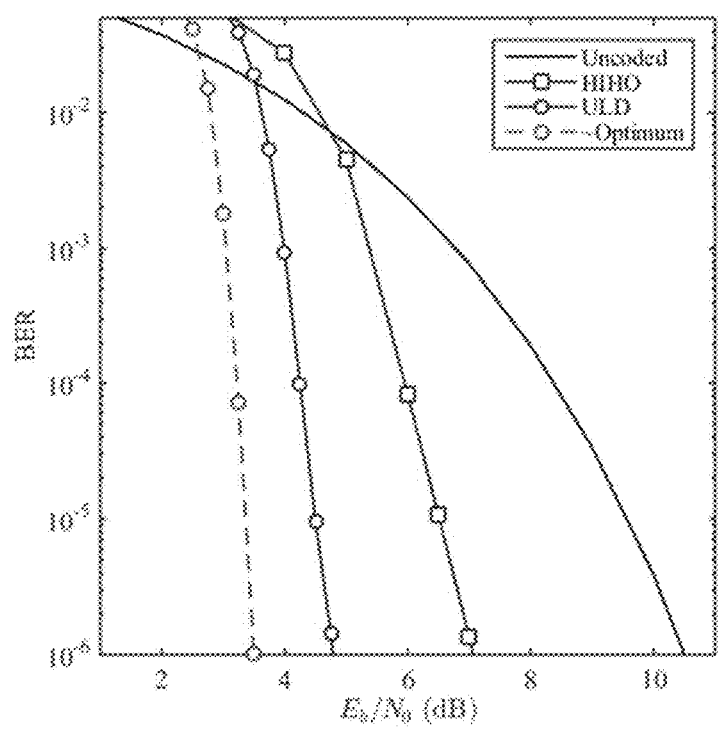
FIG. 5 illustrates BER TPC eBCH$(64,57,4)^2$.
Figure 6:
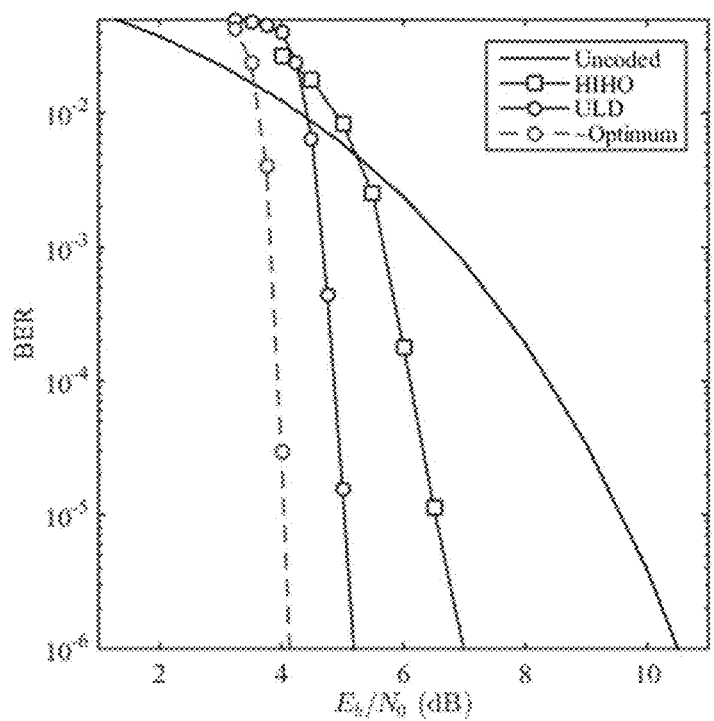
FIG. 6 illustrates BER TPC eBCH$(128,120,4)^2$.

FIG. 5 and FIG. 6 shows the BER of the eBCH$(64,57,4)^2$ and eBCH$(128,120,4)^2$ codes, for both codes, the ULD showed a significant coding gain over the HIHO decoder and about 1 dB coding gain less than the near-optimal decoder at BER=$10^{-5}$.

Therefore, the new ULD is highly efficient because its coding gain is within 1 dB from the near-optimum decoder. However, the complexity of the proposed system is substantially less due to the elimination of the HDD operation at the decoder side, and replacing them by a simple addition process similar to the one performed at the encoder.

The speed of the ULD is compared to the near-optimal decoder using the relative simulation time (RST) per iteration, where the RST is defined as the simulation time of the proposed system divided by the simulation time of the near-optimal decoder. As it can be noted in Table 1, the RST can be as low as 22%, which implies that the proposed ULD decoding time is well below the conventional system.

TABLE 1

Relative simulation time of four different TPC codes.

| | eBCH(16,11,4)$^2$ | eBCH(32,26,4)$^2$ | eBCH(64,57,4)$^2$ | eBCH(128,120,4)$^2$ |
|---|---|---|---|---|
| RST | 22.01% | 26.90% | 37.09% | 56.83% |

Conclusion

In this patent application, there is provided an efficient decoder which can be used for turbo product codes. The new decoder is highly efficient due the elimination of the hard decision decoding process used in conventional turbo decoders. In addition to the substantial complexity reduction, the new decoder will be much faster than other decoders, and hence will reduce the delay and buffering requirements at the receiver. Moreover, the error correction capability of the new decoder is comparable to the near-optimal decoder where the losses are only about one dB in terms of coding gain at bit error rate of $10^{-5}$.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, and to thereby enable others skilled in the art to best utilize the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the spirit or scope of the present invention.

The invention claimed is:

1. An improved soft decision decoder for digital communications configured to decode a received signal (r) using an improved soft decision decoding process, wherein the improved soft decision decoding process comprises:
   a) dropping parity data in the received signal (r) for forming a new vector $r_{1 \to k}$, where the new vector $r_{1 \to k}$ comprises least reliable q samples having respective indices;
   b) determining the least reliable q samples in the new vector $r_{1 \to k}$, and marking the indices of the least reliable q sample in $r_{1 \to k}$ (marked bits);
   c) computing binary decision bits of $r_{1 \to k}$;
   d) generating $2^q$ vectors (error patterns) each of which has k bits by alternating values of the marked bits between zeros and ones until all possible $2^q$ combinations are generated;
   e) generating $2^q$ different test patterns by adding each error pattern to the binary decision bits computed in (c);
   f) encoding $2^q$ test patterns to produce $2^q$ candidate codewords; and
   g) determining a successful candidate codeword among the produced $2^q$ candidate codewords, where the successful candidate is one that has a minimum Euclidean distance to the received signal (r).

2. The improved soft decision decoder as claimed in claim 1 wherein the improved soft decision decoder does not include a Hard Decision Decoding (HDD) decoder and the decoding process does not involve any Hard Decision Decoding (HDD) operations.

3. The improved soft decision decoder as claimed in claim 2, wherein the block coding is turbo coding.

4. The improved soft decision decoder as claimed in claim 3, wherein the received signal (r) is an analog signal comprising a transmitted signal (u) and channel noise (z) such that r=u+z, where the transmitted vector (u) comprises information data and parity data expressed by u=[$m_1$, $m_2$, ..., $m_k$, $p_1$, $p_2$, ..., $p_{n-k}$], where $m_i$ and $p_j$ correspond to the information data and parity data respectively.

5. The improved soft decision decoder as claimed in claim 4, wherein the received signal (r) is encoded using block coding, modulated using a modulation technique and transmitted over a communication channel subject to channel noise, wherein the improved soft decision decoder comprises a block encoder configured to encode data as part of the improved soft decision decoding process, to reduce delay and buffering requirements at a receiver.

6. The improved soft decision decoder as claimed in claim 5, wherein the channel noise is Additive White Gaussian Noise (AWGN).

7. The improved soft decision decoder as claimed in claim 6, wherein the modulation technique is binary phase-shift keying (BPSK).

8. A receiver comprising an improved soft decision decoder for digital communications configured to decode a received signal (r) using an improved soft decision decoding process, the improved soft decision decoding process comprising the steps of:
   a) dropping parity data in the received signal (r) for forming a new vector $r_{1 \to k}$, where the new vector $r_{1 \to k}$ comprises least reliable q samples having respective indices;
   b) determining the least reliable q samples in the new vector $r_{1 \to k}$, and marking the indices of the least reliable q sample in $r_{1 \to k}$ (marked bits);
   c) computing binary decision bits of $r_{1 \to k}$;
   d) generating $2^q$ vectors (error patterns) each of which has k bits by alternating values of the marked bits between zeros and ones until all possible $2^q$ combinations are generated;
   e) generating $2^q$ different test patterns by adding each error pattern to the binary decision bits computed in (c);
   f) encoding $2^q$ test patterns to produce $2^q$ candidate codewords; and
   g) determining a successful candidate codeword among the produced $2^q$ candidate codewords, where the successful candidate is one that has a minimum Euclidean distance to the received signal (r).

9. The receiver as claimed in claim 8 wherein the improved soft decision decoder does not include a Hard Decision (HD) decoder and the decoding process does not involve any Hard Decision Decoding (HDD) operations.

10. The improved soft decision decoder as claimed in claim 9, wherein the block coding is turbo coding.

11. The receiver as claimed in claim 10, wherein the received signal (r) is an analog signal comprising a transmitted signal (u) and channel noise (z) such that r=u+z, where the transmitted vector (u) comprises information data and parity data expressed by u=[$m_1, m_2, \ldots, m_k, p_1, p_2, \ldots p_{n-k}$], where $m_i$ and $p_j$ correspond to the information data and parity data respectively.

12. The receiver as claimed in claim 11, wherein the received signal (r) is encoded using block coding, modulated using a modulation technique and transmitted over a communication channel subject to channel noise, wherein the improved soft decision decoder comprises a block encoder configured to encode data as part of the improved soft decision decoding process, to reduce delay and buffering requirements at the receiver.

13. The receiver as claimed in claim 12, wherein the channel noise is Additive White Gaussian Noise (AWGN).

14. The receiver as claimed in claim 13, wherein the modulation technique is binary phase-shift keying (BPSK).

15. An improved soft decision decoding process for decoding a received signal (r), the improved soft decision decoding process comprising:
   a) dropping parity data in the received signal (r) for forming a new vector $r_{1 \to k}$, where the new vector $r_{1 \to k}$ comprises least reliable q samples having respective indices;
   b) determining the least reliable q samples in the new vector $r_{1 \to k}$, and marking the indices of the least reliable q sample in $r_{1 \to k}$ (marked bits);
   c) computing binary decision bits of $r_{1 \to k}$;
   d) generating $2^q$ vectors (error patterns) each of which has k bits by alternating values of the marked bits between zeros and ones until all possible $2^q$ combinations are generated;
   e) generating $2^q$ different test patterns by adding each error pattern to the binary decision bits computed in (c);
   f) encoding $2^q$ test patterns to produce $2^q$ candidate codewords; and
   g) determining a successful candidate codeword among the produced $2^q$ candidate codewords, where the successful candidate is one that has a minimum Euclidean distance to the received signal (r).

16. The improved soft decision decoding process as claimed in claim 15 wherein the improved soft decision decoding process does not involve any Hard Decision Decoding (HDD) operations.

17. The improved soft decision decoding process as claimed in claim 16, wherein the block coding is turbo coding.

18. The improved soft decision decoding process as claimed in claim 17, wherein the received signal (r) is an analog signal comprising a transmitted signal (u) and channel noise (z) such that r=u+z, where the transmitted vector (u) comprises information data and parity data expressed by u=[$m_1, m_2, \ldots, m_k, p_1, p_2, \ldots, p_{n-k}$], where $m_i$ and $p_j$ correspond to the information data and parity data respectively.

19. The improved soft decision decoding process as claimed in claim 18, wherein the received signal (r) is encoded using block coding, modulated using a modulation technique and transmitted over a communication channel subject to channel noise, wherein the improved soft decision decoding process comprises encoding data using a block encoder as part of the improved soft decision decoding process, to reduce delay and buffering requirements at a receiver.

20. The improved soft decision decoding process as claimed in claim 19, wherein the channel noise is Additive White Gaussian Noise (AWGN), and the modulation technique is binary phase-shift keying (BPSK).

\* \* \* \* \*